(12) United States Patent
Zhao et al.

(10) Patent No.: US 9,929,703 B1
(45) Date of Patent: Mar. 27, 2018

(54) AMPLIFIER WITH CONFIGURABLE FINAL OUTPUT STAGE

(71) Applicant: Cirrus Logic International Semiconductor Ltd., Edinburgh (GB)

(72) Inventors: Xin Zhao, Austin, TX (US); Tejasvi Das, Austin, TX (US); Xiaofan Fei, Austin, TX (US); Alan Mark Morton, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/277,465

(22) Filed: Sep. 27, 2016

(51) Int. Cl.
| | | |
|---|---|---|
| H03F 3/38 | (2006.01) | |
| H03F 3/217 | (2006.01) | |
| H03F 3/187 | (2006.01) | |
| H03F 1/34 | (2006.01) | |

(52) U.S. Cl.
CPC ........... *H03F 3/2171* (2013.01); *H03F 1/342* (2013.01); *H03F 3/187* (2013.01); *H03F 3/217* (2013.01); *H03F 3/2173* (2013.01); *H03F 3/38* (2013.01); *H03F 2200/345* (2013.01); *H03F 2200/351* (2013.01)

(58) Field of Classification Search
CPC ...... H03F 3/217; H03F 3/2171; H03F 3/2173; H03F 3/38; H03F 2200/432
USPC ....................................... 330/10, 207 A, 251
See application file for complete search history.

(56) References Cited

U.S. PATENT DOCUMENTS

| | | |
|---|---|---|
| 4,346,349 A | 8/1982 | Yokoyama |
| 4,441,081 A | 4/1984 | Jenkins |
| 4,446,440 A | 5/1984 | Bell |
| 4,493,091 A | 1/1985 | Gundry |
| 4,890,107 A | 12/1989 | Pearce |
| 4,972,436 A | 11/1990 | Halim et al. |

(Continued)

FOREIGN PATENT DOCUMENTS

| | | |
|---|---|---|
| EP | 0351788 A2 | 7/1989 |
| EP | 0966105 A2 | 12/1999 |

(Continued)

OTHER PUBLICATIONS

Thaden, Rainer et al., A Loudspeaker Management System with FIR/IRR Filtering; AES 32nd International Conference, Hillerod, Denmark, Sep. 21-23, 2007; pp. 1-12.

(Continued)

*Primary Examiner* — Khanh V Nguyen
(74) *Attorney, Agent, or Firm* — Jackson Walker L.L.P.

(57) ABSTRACT

An amplifier may include a first stage configured to receive an input signal at an amplifier input and generate an intermediate signal which is a function of the input signal, and a final output stage configured to generate an output signal which is a function of the intermediate signal at an amplifier output, and a signal feedback network coupled between the amplifier output and input. The final output stage may be switchable among a plurality of modes including at least a first mode in which the final output stage generates the output signal as a modulated output signal which is a function of the intermediate signal, and a second mode in which the final output stage generates the output signal as an unmodulated output signal which is a function of the intermediate signal. Structure of the feedback network and the first stage may remain static when switching between modes.

30 Claims, 3 Drawing Sheets

(56) References Cited

U.S. PATENT DOCUMENTS

| | | |
|---|---|---|
| 4,999,628 A | 3/1991 | Kakaubo et al. |
| 4,999,830 A | 3/1991 | Agazzi |
| 5,077,539 A | 12/1991 | Howatt |
| 5,148,167 A | 9/1992 | Ribner |
| 5,198,814 A | 3/1993 | Ogawara et al. |
| 5,272,449 A | 12/1993 | Izawa |
| 5,321,758 A | 6/1994 | Charpentier et al. |
| 5,323,159 A | 6/1994 | Imamura et al. |
| 5,343,161 A | 8/1994 | Tokumo et al. |
| 5,550,923 A | 7/1996 | Hotvet et al. |
| 5,600,317 A | 2/1997 | Knoth et al. |
| 5,714,956 A | 2/1998 | Jahne et al. |
| 5,719,641 A | 2/1998 | Mizoguchi |
| 5,796,303 A | 8/1998 | Vinn et al. |
| 5,808,575 A | 9/1998 | Himeno et al. |
| 5,810,477 A | 9/1998 | Abraham et al. |
| 6,088,461 A | 7/2000 | Lin |
| 6,160,455 A | 12/2000 | French et al. |
| 6,201,490 B1 | 3/2001 | Kawano et al. |
| 6,271,780 B1 | 8/2001 | Gong et al. |
| 6,333,707 B1 | 12/2001 | Oberhammer et al. |
| 6,353,404 B1 | 3/2002 | Kuroiwa |
| 6,542,612 B1 | 4/2003 | Needham |
| 6,614,297 B2 | 9/2003 | Score et al. |
| 6,683,494 B2 | 1/2004 | Stanley |
| 6,745,355 B1 | 6/2004 | Tamura |
| 6,768,443 B2 | 7/2004 | Willis |
| 6,822,595 B1 | 11/2004 | Robinson |
| 6,853,242 B2 | 2/2005 | Melanson et al. |
| 6,888,888 B1 | 5/2005 | Tu et al. |
| 6,897,794 B2 | 5/2005 | Kuyel et al. |
| 6,989,955 B2 | 1/2006 | Ziemer et al. |
| 7,020,892 B2 | 3/2006 | Levesque et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,279,964 B2 * | 10/2007 | Bolz ............... G10K 11/178 330/10 |
| 7,302,354 B2 | 11/2007 | Zhuge |
| 7,312,734 B2 | 12/2007 | McNeill et al. |
| 7,315,204 B2 * | 1/2008 | Seven ............... H03F 1/0277 330/51 |
| 7,365,664 B2 | 4/2008 | Caduff et al. |
| 7,378,902 B2 | 5/2008 | Sorrells et al. |
| 7,385,443 B1 | 6/2008 | Denison |
| 7,403,010 B1 | 7/2008 | Hertz |
| 7,440,891 B1 | 10/2008 | Shozakai et al. |
| 7,522,677 B2 | 4/2009 | Liang |
| 7,583,215 B2 | 9/2009 | Yamamoto et al. |
| 7,671,768 B2 | 3/2010 | De Ceuninck |
| 7,679,538 B2 | 3/2010 | Tsang |
| 7,737,776 B1 | 6/2010 | Cyrusian |
| 7,893,856 B2 | 2/2011 | Ek et al. |
| 7,924,189 B2 | 4/2011 | Sayers |
| 7,937,106 B2 | 5/2011 | Sorrells et al. |
| 8,060,663 B2 | 11/2011 | Murray et al. |
| 8,130,126 B2 | 3/2012 | Breitschaedel et al. |
| 8,298,425 B2 | 10/2012 | Kanbe |
| 8,330,631 B2 | 12/2012 | Kumar et al. |
| 8,362,936 B2 | 1/2013 | Ledzius et al. |
| 8,462,035 B2 | 6/2013 | Schimper et al. |
| 8,483,753 B2 | 7/2013 | Behzad et al. |
| 8,508,397 B2 | 8/2013 | Hisch |
| 8,717,211 B2 | 5/2014 | Miao et al. |
| 8,836,551 B2 | 9/2014 | Nozaki |
| 8,873,182 B2 | 10/2014 | Liao et al. |
| 8,878,708 B1 | 11/2014 | Sanders et al. |
| 8,952,837 B2 | 2/2015 | Kim et al. |
| 9,071,201 B2 | 6/2015 | Jones et al. |
| 9,071,267 B1 | 6/2015 | Schneider et al. |
| 9,071,268 B1 | 6/2015 | Schneider et al. |
| 9,118,401 B1 | 8/2015 | Nieto et al. |
| 9,148,164 B2 | 9/2015 | Schneider et al. |
| 9,171,552 B1 | 10/2015 | Yang |
| 9,178,462 B2 | 11/2015 | Kurosawa et al. |
| 9,306,588 B2 | 4/2016 | Das et al. |
| 9,337,795 B2 | 5/2016 | Das et al. |
| 9,391,576 B1 | 7/2016 | Satoskar et al. |
| 9,503,027 B2 | 11/2016 | Zanbaghi |
| 9,525,940 B1 | 12/2016 | Schneider et al. |
| 9,543,975 B1 | 1/2017 | Melanson et al. |
| 9,584,911 B2 | 2/2017 | Das et al. |
| 9,596,537 B2 | 3/2017 | He et al. |
| 9,635,310 B2 | 4/2017 | Chang et al. |
| 9,762,255 B1 | 9/2017 | Satoskar et al. |
| 9,774,342 B1 | 9/2017 | Schneider et al. |
| 9,807,504 B2 | 10/2017 | Melanson et al. |
| 9,813,814 B1 | 11/2017 | Satoskar |
| 2001/0001547 A1 | 5/2001 | Delano et al. |
| 2001/0009565 A1 | 7/2001 | Singvall |
| 2004/0078200 A1 | 4/2004 | Alves |
| 2004/0184621 A1 | 9/2004 | Andersen et al. |
| 2005/0068097 A1 | 3/2005 | Kim et al. |
| 2005/0084037 A1 | 4/2005 | Liang |
| 2005/0258989 A1 | 11/2005 | Li et al. |
| 2005/0276359 A1 | 12/2005 | Xiong |
| 2006/0056491 A1 | 3/2006 | Lim et al. |
| 2006/0064037 A1 | 3/2006 | Shalon et al. |
| 2006/0098827 A1 | 5/2006 | Paddock et al. |
| 2006/0261886 A1 | 11/2006 | Hansen et al. |
| 2006/0284675 A1 | 12/2006 | Krochmal et al. |
| 2007/0018719 A1 | 1/2007 | Seven |
| 2007/0026837 A1 | 2/2007 | Bagchi |
| 2007/0057720 A1 | 3/2007 | Hand et al. |
| 2007/0092089 A1 | 4/2007 | Seefeldt et al. |
| 2007/0103355 A1 | 5/2007 | Yamada |
| 2007/0120721 A1 | 5/2007 | Caduff et al. |
| 2007/0123184 A1 | 5/2007 | Nesimoglu et al. |
| 2007/0146069 A1 | 6/2007 | Wu et al. |
| 2008/0012639 A1 | 1/2008 | Mels |
| 2008/0030577 A1 | 2/2008 | Cleary et al. |
| 2008/0114239 A1 | 5/2008 | Randall et al. |
| 2008/0143436 A1 | 6/2008 | Xu |
| 2008/0159444 A1 | 7/2008 | Terada |
| 2008/0198048 A1 | 8/2008 | Klein et al. |
| 2008/0292107 A1 | 11/2008 | Bizjak |
| 2009/0015327 A1 | 1/2009 | Wu et al. |
| 2009/0021643 A1 | 1/2009 | Hsueh et al. |
| 2009/0051423 A1 | 2/2009 | Miaille et al. |
| 2009/0058531 A1 | 3/2009 | Hwang et al. |
| 2009/0084586 A1 | 4/2009 | Nielsen |
| 2009/0220110 A1 | 9/2009 | Bazarjani et al. |
| 2010/0168882 A1 | 7/2010 | Zhang et al. |
| 2010/0183163 A1 | 7/2010 | Matsui et al. |
| 2011/0013733 A1 | 1/2011 | Martens et al. |
| 2011/0025540 A1 | 2/2011 | Katsis |
| 2011/0029109 A1 | 2/2011 | Thomsen et al. |
| 2011/0063148 A1 | 3/2011 | Kolze et al. |
| 2011/0096370 A1 | 4/2011 | Okamoto |
| 2011/0136455 A1 | 6/2011 | Sundstrom et al. |
| 2011/0150240 A1 | 6/2011 | Akiyama et al. |
| 2011/0170709 A1 | 7/2011 | Guthrie et al. |
| 2011/0188671 A1 | 8/2011 | Anderson et al. |
| 2011/0228952 A1 | 9/2011 | Lin |
| 2011/0242614 A1 | 10/2011 | Okada |
| 2011/0268301 A1 | 11/2011 | Nielsen et al. |
| 2011/0285463 A1 * | 11/2011 | Walker ............... H03F 3/217 330/251 |
| 2012/0001786 A1 | 1/2012 | Hisch |
| 2012/0047535 A1 | 2/2012 | Bennett et al. |
| 2012/0133411 A1 | 5/2012 | Miao et al. |
| 2012/0177201 A1 | 7/2012 | Ayling et al. |
| 2012/0177226 A1 | 7/2012 | Silverstein et al. |
| 2012/0188111 A1 | 7/2012 | Ledzius et al. |
| 2012/0207315 A1 | 8/2012 | Kimura et al. |
| 2012/0242521 A1 | 9/2012 | Kinyua |
| 2012/0250893 A1 | 10/2012 | Carroll et al. |
| 2012/0263090 A1 | 10/2012 | Porat et al. |
| 2012/0274490 A1 | 11/2012 | Kidambi et al. |
| 2012/0280726 A1 | 11/2012 | Colombo et al. |
| 2013/0095870 A1 | 4/2013 | Phillips et al. |
| 2013/0106635 A1 | 5/2013 | Doi |
| 2013/0129117 A1 | 5/2013 | Thomsen et al. |

(56) References Cited

U.S. PATENT DOCUMENTS

| | | | |
|---|---|---|---|
| 2013/0188808 | A1 | 7/2013 | Pereira et al. |
| 2013/0241753 | A1 | 9/2013 | Nozaki |
| 2013/0241755 | A1 | 9/2013 | Chen et al. |
| 2014/0044280 | A1 | 2/2014 | Jiang |
| 2014/0105256 | A1 | 4/2014 | Hanevich et al. |
| 2014/0105273 | A1 | 4/2014 | Chen et al. |
| 2014/0126747 | A1 | 5/2014 | Huang |
| 2014/0135077 | A1 | 5/2014 | Leviant et al. |
| 2014/0184332 | A1 | 7/2014 | Shi et al. |
| 2014/0269118 | A1 | 9/2014 | Taylor et al. |
| 2014/0368364 | A1 | 12/2014 | Hsu |
| 2015/0009079 | A1 | 1/2015 | Bojer |
| 2015/0170663 | A1 | 6/2015 | Disch et al. |
| 2015/0214974 | A1 | 7/2015 | Currivan |
| 2015/0214975 | A1 | 7/2015 | Gomez et al. |
| 2015/0295584 | A1 | 10/2015 | Das et al. |
| 2015/0327174 | A1 | 11/2015 | Rajagopal et al. |
| 2015/0381130 | A1 | 12/2015 | Das et al. |
| 2016/0072465 | A1 | 3/2016 | Das et al. |
| 2016/0080862 | A1 | 3/2016 | He et al. |
| 2016/0080865 | A1 | 3/2016 | He et al. |
| 2016/0173112 | A1 | 6/2016 | Das et al. |
| 2016/0181988 | A1 | 6/2016 | Du et al. |
| 2016/0286310 | A1 | 9/2016 | Das et al. |
| 2016/0365081 | A1 | 12/2016 | Satoskar et al. |
| 2017/0047895 | A1 | 2/2017 | Zanbaghi |
| 2017/0150257 | A1 | 5/2017 | Das et al. |

FOREIGN PATENT DOCUMENTS

| | | |
|---|---|---|
| EP | 1244218 A1 | 9/2002 |
| EP | 1575164 A2 | 9/2005 |
| EP | 1689075 A1 | 8/2006 |
| EP | 1753130 A1 | 2/2007 |
| EP | 1798852 A | 6/2009 |
| EP | 2207264 A1 | 7/2010 |
| GB | 1599401 A | 9/1981 |
| GB | 2119189 A | 11/1983 |
| GB | 2307121 A | 6/1997 |
| GB | 2507096 A | 4/2014 |
| GB | 2527637 A | 12/2015 |
| GB | 2527677 B | 10/2016 |
| GB | 2537694 A | 10/2016 |
| GB | 2537697 A | 10/2016 |
| GB | 2539517 A | 12/2016 |
| JP | 2008294803 A | 12/2008 |
| WO | WO0054403 A1 | 9/2000 |
| WO | 02/37686 A2 | 5/2002 |
| WO | 2004057754 A1 | 7/2004 |
| WO | 2006018750 A1 | 2/2006 |
| WO | 2007005380 A2 | 1/2007 |
| WO | 2007136800 A2 | 11/2007 |
| WO | 2008067260 A1 | 6/2008 |
| WO | 2014113471 A1 | 7/2014 |
| WO | 2015160655 A1 | 10/2015 |
| WO | 2016040165 A1 | 3/2016 |
| WO | 2016040171 A1 | 3/2016 |
| WO | 2016040177 A1 | 3/2016 |
| WO | 2016160336 A1 | 10/2016 |
| WO | 2016202636 A1 | 12/2016 |

OTHER PUBLICATIONS

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.

GB Patent Application No. 1419651.3, Improved Analogue-to-Digital Convertor, filed Nov. 4, 2014, 65 pages.

Combined Search and Examination Report, GB Application No. GB1506258.1, dated Oct. 21, 2015, 6 pages.

International Search Report and Written Opinion, International Patent Application No. PCT/US2015/025329, dated Aug. 11, 2015, 9 pages.

International Search Report and Written Opinion, International Patent Application No. PCT/US2015/048633, dated Dec. 10, 2015, 11 pages.

International Search Report and Written Opinion, International Patent Application No. PCT/US2015/048591, dated Dec. 10, 2015, 11 pages.

Combined Search and Examination Report, GB Application No. GB1510578.6, dated Aug. 3, 2015, 3 pages.

International Search Report and Written Opinion, International Application No. PCT/US2015/056357, dated Jan. 29, 2015, 13 pages.

Combined Search and Examination Report, GB Application No. GB1514512.1, dated Feb. 11, 2016, 7 pages.

International Search Report and Written Opinion, International Application No. PCT/US2015/048609, dated Mar. 23, 2016, 23 pages.

International Search Report and Written Opinion, International Application No. PCT/US2016/022578, dated Jun. 22, 2016, 12 pages.

Combined Search and Examination Report, GB Application No. GB1600528.2, dated Jul. 7, 2016, 8 pages.

Combined Search and Examination Report, GB Application No. GB1603628.7, dated Aug. 24, 2016, 6 pages.

International Search Report and Written Opinion, International Application No. PCT/EP2016/062862, dated Aug. 26, 2016, 14 pages.

Combined Search and Examination Report, GB Application No. GB1602288.1, dated Aug. 9, 2016, 6 pages.

International Search Report and Written Opinion of the International Searching Authority, International Application No. PCT/US2016/065134, dated Mar. 15, 2017.

International Search Report and Written Opinion of the International Searching Authority, International Application No. PCT/US2016/040096, dated Mar. 24, 2017.

International Search Report and Written Opinion of the International Searching Authority, International Application No. PCT/US2017/014240, dated Apr. 24, 2017.

Groeneweg, B.P., et al., A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-1016.

Chen, K., et al., A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.

Combined Search and Examination Report under Sections 17 and 18(3) of the UKIPO, Application No. GB1620427.3, dated Jun. 1, 2017.

Combined Search and Examination Report under Sections 17 and 18(3) of the UKIPO, Application No. GB1620428.1, dated Jul. 21, 2017.

Combined Search and Examination Report under Sections 17 and 18(3), United Kingdom Intellectual Property Office, Application No. GB1702540.4, dated Oct. 2, 2017.

Combined Search and Examination Report under Sections 17 and 18(3), United Kingdom Intellectual Property Office, Application No. GB1702655.0, dated Oct. 24, 2017.

Combined Search and Examination Report under Sections 17 and 18(3), United Kingdom Intellectual Property Office, Application No. GB1706693.7, dated Oct. 26, 2017.

Combined Search and Examination Report under Sections 17 and 18(3), United Kingdom Intellectual Property Office, Application No. GB1706690.3, dated Oct. 30, 2017.

Search Report under Section 17, United Kingdom Intellectual Property Office, Application No. GB1702656.8, dated Oct. 31, 2017.

International Search Report and Written Opinion of the International Searching Authority, International Patent Application No. PCT/US2017/045861, dated Nov. 14, 2017.

(56) References Cited

OTHER PUBLICATIONS

International Search Report and Written Opinion of the International Searching Authority, International Patent Application No. PCT/US2017/046083, dated Nov. 14, 2017.
Combined Search and Examination Report under Sections 17 and 18(3), United Kingdom Intellectual Property Office, Application No. GB1708546.5, dated Nov. 22, 2017.
Chen, Kuo-Hsin, et al., A 106dB PSRR Direct Battery Connected Reconfigurable Class-AB/D Speaker Amplifier or Hands-Free/Receiver 2-in-1 Loudspeaker, Solid State Circuits Conference (A-SSCC), 2011 IEEE Asian, Nov. 14, 2011, pp. 221-224.
International Search Report and Written Opinion of the International Searching Authority, International Patent Application No. PCT/US2017/052439, dated Dec. 14, 2017.
Combined Search and Examination Report under Sections 17 and 18(3), United Kingdom Intellectual Property Office, Application No. GB1708544.0, dated Nov. 28, 2017.

\* cited by examiner

AMPLIFIER WITH CONFIGURABLE FINAL OUTPUT STAGE

FIELD OF DISCLOSURE

The present disclosure relates in general to circuits for audio devices, including without limitation personal audio devices, such as wireless telephones and media players, and more specifically, to systems and methods relating to an amplifier with a configurable final output stage.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches, and not as linear gain devices as in other amplifiers (e.g., class-A, class-B, and class-AB amplifiers). In a class-D amplifier, an analog signal to be amplified may be converted to a series of pulses by pulse-width modulation, pulse-density modulation, or other method of modulation, such that the analog signal is converted into a modulated signal in which a characteristic of the pulses of the modulated signal (e.g., pulse widths, pulse density, etc.) are a function of the magnitude of the analog signal. After amplification with a class-D amplifier, the output pulse train may be converted back to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers. However, class-D amplifiers may have high quiescent power when amplifying low-magnitude signals and may require a large amount of area in order to meet stringent dynamic range requirements in audio devices.

SUMMARY

In accordance with the teachings of the present disclosure, one or more disadvantages and problems associated with existing approaches to signal amplification in an audio system may be reduced or eliminated.

In accordance with embodiments of the present disclosure, an amplifier may include a plurality of stages comprising at least a first stage configured to receive an input signal at an amplifier input and generate an intermediate signal which is a function of the input signal, and a final output stage configured to generate an output signal at an amplifier output, wherein the output signal is a function of the intermediate signal, and a signal feedback network coupled between the amplifier output and the amplifier input. The final output stage may be switchable among a plurality of modes including at least a first mode in which the final output stage generates the output signal as a modulated output signal which is a function of the intermediate signal, and a second mode in which the final output stage generates the output signal as an unmodulated output signal which is a function of the intermediate signal. Structure of the feedback network and the first stage may remain static when switching between the first mode and the second mode and when switching between the second mode and the first mode.

In accordance with these and other embodiments of the present disclosure, a method for operating an amplifier having a plurality of stages comprising at least a first stage configured to receive an input signal at an amplifier input and generate an intermediate signal which is a function of the input signal, and a final output stage configured to generate an output signal at an amplifier output, wherein the output signal is a function of the intermediate signal, and a signal feedback network coupled between the amplifier output and the amplifier input, may be provided. The method may include switching the final output stage among a plurality of modes including at least a first mode in which the final output stage generates the output signal as a modulated output signal which is a function of the intermediate signal, and a second mode in which the final output stage generates the output signal as an unmodulated output signal which is a function of the intermediate signal, wherein the structure of the feedback network and the first stage remains static when switching between the first mode and the second mode and when switching between the second mode and the first mode.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
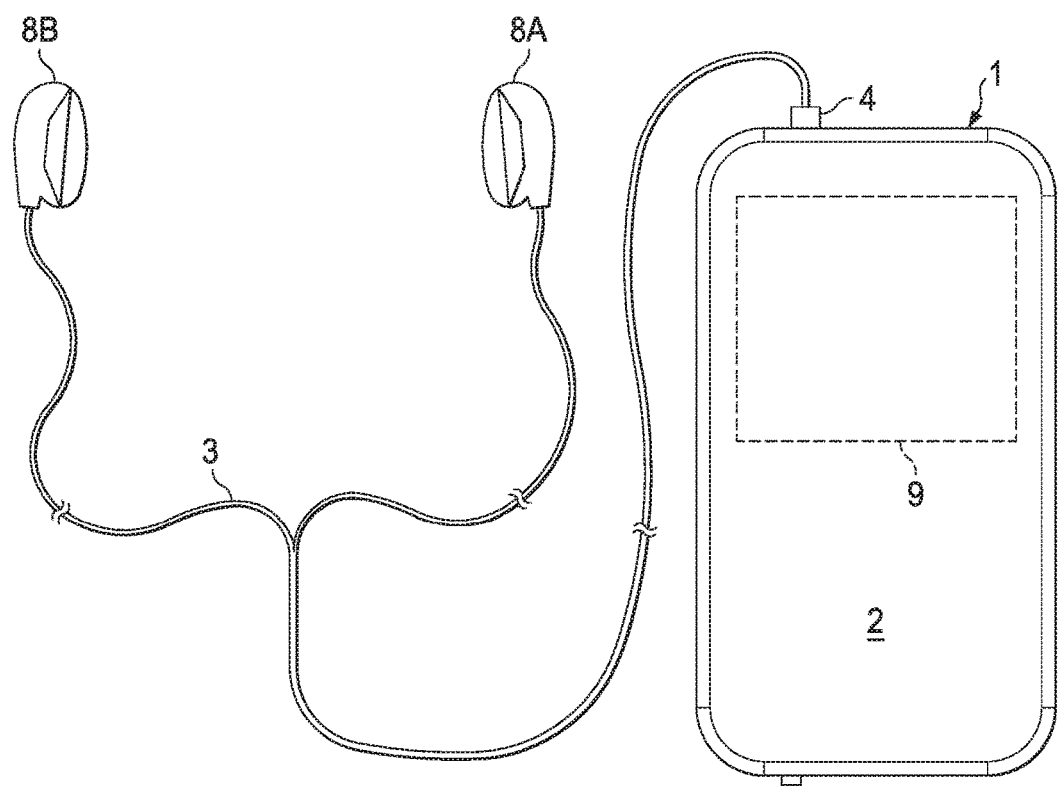
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
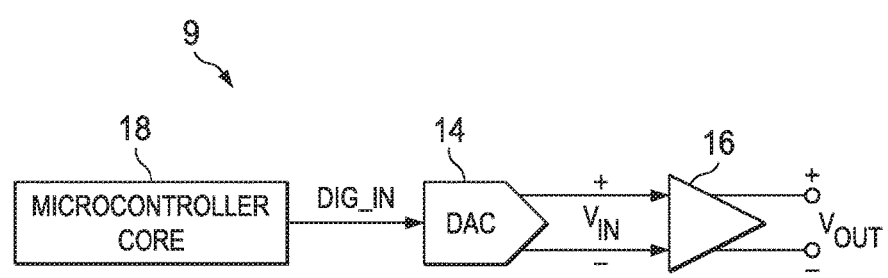
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
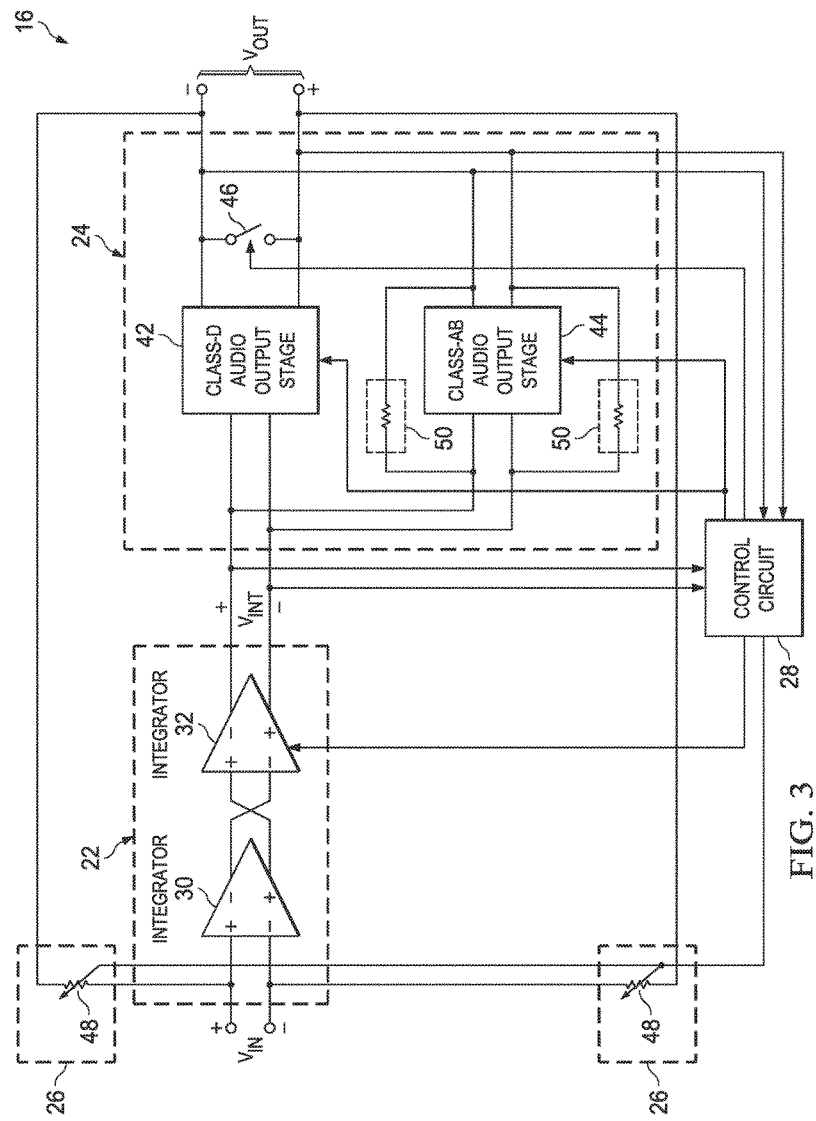
FIG. 3 is a block diagram of selected components of an example amplifier, in accordance with embodiments of the present disclosure.

FIG. 3 is a block diagram of selected components of an example amplifier 16, in accordance with embodiments of the present disclosure. As shown in FIG. 3, amplifier 16 may include a first stage 22 (e.g., an analog front end) configured to receive analog input signal $V_{IN}$ at an amplifier input of amplifier 16 and generate an intermediate signal $V_{INT}$ which is a function of analog input signal $V_{IN}$, a final output stage 24 configured to generate audio output signal $V_{OUT}$ at an amplifier output of amplifier 16 as a function of intermediate signal $V_{INT}$, a signal feedback network 26 coupled between the amplifier output and the amplifier input, and a control circuit 28 for controlling the operation of certain components of amplifier 16, as described in greater detail below.

First stage 22 may include any suitable analog front end circuit for conditioning analog input signal $V_{IN}$ for use by final output stage 24. For example, first stage 22 may include one or more analog integrators 32 cascaded in series, as shown in FIG. 3.

Final output stage 24 may include any suitable driving circuit for driving audio output signal $V_{OUT}$ as a function of intermediate signal $V_{INT}$ (thus, also making audio output signal $V_{OUT}$ a function of analog input signal $V_{IN}$) wherein final output stage 24 is switchable among a plurality of modes including at least a first mode in which final output stage 24 generates audio output signal $V_{OUT}$ as a modulated output signal which is a function of intermediate signal $V_{INT}$ and a second mode in which final output stage 24 generates audio output signal $V_{OUT}$ as an unmodulated output signal which is a function of intermediate signal $V_{INT}$. To carry out this functionality, final output stage 24 may include a class-D audio output stage 42 which may be enabled in the first mode (and disabled in the second mode) to generate audio output signal $V_{OUT}$ as a modulated output signal which is a function of intermediate signal $V_{INT}$ and a class-AB audio output stage 44 which may be enabled in the second mode (and disabled in the first mode) to generate audio output signal $V_{OUT}$ as an unmodulated output signal which is a function of intermediate signal $V_{INT}$.

Class-D audio output stage 42 may comprise any suitable system, device, or apparatus configured to amplify intermediate signal $V_{INT}$ and convert intermediate signal $V_{INT}$ into a series of pulses by pulse-width modulation, pulse-density modulation, or another method of modulation, such that intermediate signal $V_{INT}$ is converted into a modulated signal in which a characteristic of the pulses of the modulated signal (e.g., pulse widths, pulse density, etc.) is a function of the magnitude of intermediate signal $V_{INT}$. After amplification by class-D audio output stage 42, its output pulse train may be converted back to an unmodulated analog signal by passing through a passive low-pass filter, wherein such low-pass filter may be inherent in output circuitry of class-D audio output stage 42 or a load driven by final output stage 24. As shown in FIG. 3, class-D audio output stage 42 may include a control input for receiving a control input from control circuit 28 in order to selectively enable class-D audio output stage 42 during the first mode and disable class-D audio output stage 42 during the second mode (e.g., prevent class-D audio output stage 42 from driving the amplifier output of amplifier 16 by disabling or decoupling a supply voltage from class-D audio output stage 42 or by disabling or decoupling driving devices of the amplifier output of amplifier 16).

Class-AB audio output stage 44 may comprise any suitable system, device, or apparatus configured to amplify intermediate signal $V_{INT}$ with a linear gain and convert intermediate signal $V_{INT}$ into an unmodulated audio output signal $V_{OUT}$. For example, in some embodiments, unmodulated audio output signal $V_{OUT}$ may include a continuous-time baseband signal (e.g., an audio baseband signal). As shown in FIG. 3, class-AB audio output stage 44 may include a control input for receiving a control input from control circuit 28 in order to selectively enable class-AB audio output stage 44 during the second mode and disable class-AB audio output stage 44 during the first mode (e.g., prevent class-AB audio output stage 44 from driving the amplifier output of amplifier 16 by disabling or decoupling a supply voltage from class-AB audio output stage 44 or by disabling or decoupling driving devices of the amplifier output of amplifier 16).

As shown in FIG. 3, final output stage 24 may include a signal feedback network 50 for feeding back a signal indicative of audio output signal $V_{OUT}$ to the input of final output stage 24, thus forming a feedback loop around Class-AB audio output stage 44. For example, as shown in FIG. 3, signal feedback network 50 may include resistors and/or other suitable circuit elements.

In some embodiments, a signal gain (e.g., $V_{OUT}/V_{INT}$) of final output stage 24 in the first mode may be approximately equal to the signal gain of final output stage 24 in the second mode. In these and other embodiments, an offset (e.g., direct current offset) of final output stage 24 in the first mode may be approximately equal to the offset of final output stage 24 in the second mode.

As shown in FIG. 3, final output stage 24 may also include a clamp 46, which may be embodied as a switch, coupled between the output terminals of the amplifier output of amplifier 16, with clamp 46 having a control input received from control circuit 28 for selectively enabling clamp 46 (to short the output terminals together) and disabling clamp 46, as described in greater detail below.

Signal feedback network 26 may include any suitable feedback network for feeding back a signal indicative of audio output signal $V_{OUT}$ to the amplifier input of amplifier 16). For example, as shown in FIG. 3, signal feedback network 26 may include variable feedback resistors 48, wherein resistances of variable feedback resistors 48 are controlled by control signals received from control circuit 28, as described in greater detail below.

Thus, final output stage 24 may operate as an open-loop switched-mode driver in the first mode and may operate as a continuous-time closed-loop amplifier in the second mode. In addition, when the final output stage is operating in the second mode, amplifier 16 may comprise a first feedback loop including signal feedback network 26 and a second feedback loop coupled between the amplifier output and the intermediate output implemented by signal feedback network 50.

Control circuit 28 may include any suitable system, device, or apparatus configured to receive information indicative of audio output voltage $V_{OUT}$, intermediate signal $V_{INT}$, and/or other operational characteristic of amplifier 16, and based at least thereon, control operation of one or more components of amplifier 16. For example, control circuit 28 may be configured to, based on a characteristic of analog input signal $V_{IN}$ (e.g., which may be determined from receiving and analyzing intermediate signal $V_{INT}$ and/or audio output signal $V_{OUT}$), switch between the first mode and the second mode of final output stage 24. Such characteristic may include one or more of a frequency of analog input signal $V_{IN}$, an amplitude of analog input signal $V_{IN}$, a signal-to-noise ratio of analog input signal $V_{IN}$, a noise floor of analog input signal $V_{IN}$, or another noise characteristic of analog input signal $V_{IN}$. For example, in some embodiments, control circuit 28 may be configured to switch final output stage 24 from the first mode to the second mode when an amplitude of analog input signal $V_{IN}$ decreases below a threshold amplitude, and may be configured to switch final output stage 24 from the second mode to the first mode when an amplitude of analog input signal $V_{IN}$ increases above the same threshold amplitude or another threshold amplitude. In some embodiments, to reduce audio artifacts associated with switching between modes, control circuit 28 may also be configured to switch between modes only when the amplitude of audio output signal $V_{OUT}$ is approximately zero (e.g., when a modulated signal generated by class-D audio output stage 42 is at its minimum voltage in its generated pulse train).

In these and other embodiments, control circuit 28 may further be configured to, in order to reduce audio artifacts induced by switching between the two modes, cause final output stage 24 to switch between the first mode and the second mode at an approximate completion of a modulation period of the modulated output signal output by Class-D audio output stage 42, and cause final output stage 24 to switch between the second mode and the first mode at an approximate beginning of another modulation period of the modulated output signal output by Class-D audio output stage 42.

In addition, control circuit 28 may also be configured to perform calibration of final output stage 24. For example, control circuit 28 may receive and analyze intermediate signal $V_{INT}$ and audio output signal $V_{OUT}$ to determine a gain of class-D audio output stage 42 (e.g., the signal gain of final output stage 24 in the first mode) and a gain of class-AB audio output stage 44 (e.g., the signal gain of final output stage 24 in the second mode), and based thereon, modify the gain of class-D audio output stage 42 and/or the gain of class-AB audio output stage 44 in order to calibrate the signal gain of final output stage 24 in the second mode to match the signal gain of final output stage 24 in the first mode. As another example, control circuit 28 may receive and analyze intermediate signal $V_{INT}$ and/or audio output signal $V_{OUT}$ to determine an offset (e.g., direct current offset) of class-D audio output stage 42 (e.g., the offset of final output stage 24 in the first mode) and an offset of class-AB audio output stage 44 (e.g., the offset of final output stage 24 in the second mode), and based thereon, modify the offset of class-D audio output stage 42 and/or the offset of class-AB audio output stage 44 in order to calibrate the offset of final output stage 24 in the second mode to match the offset of final output stage 24 in the first mode.

In these and other embodiments, control circuit 28 may also be configured to control characteristics of first stage 22 (e.g., integrator 32) and/or signal feedback network 26. Control circuit 28 may maintain such characteristics and structure of first stage 22 and signal feedback network 26 as static when switching between the first mode and the second mode of final output stage 24 and when switching between the second mode and the first mode. Maintaining the characteristics and structure of first stage 22 and signal feedback network 26 as static when switching between modes allows the modes to share the same analog front end and feedback network, thus reducing or minimizing the likelihood of mismatched signal gain and offset between the modes, and thus reducing or minimizing audio artifacts caused by switching between modes. However, after control circuit 28 has switched final output stage 24 to the second mode (e.g., amplifier output driven by class-AB audio output stage 44), control circuit 28 may modify characteristics of first stage 22 and/or signal feedback network 26 in order to decrease a noise floor of amplifier 16. For example, in some embodiments, control circuit 28 may modify characteristics of integrator 32 (e.g., resistances and/or capacitances of filters internal to integrator 32) and/or other components of first stage 22 in order to decrease a noise floor of amplifier 16 when final output stage 24 operates in the second mode. As another example, in these and other embodiments, control circuit 28 may modify characteristics of signal feedback network 26 (e.g., resistances of variable feedback resistors 48) in order to decrease a noise floor of amplifier 16 when final output stage 24 operates in the second mode. When making such modification, control circuit 28 may, before switching final output stage from the second mode to the first mode, return such characteristics to their unmodified states.

Figure 4:
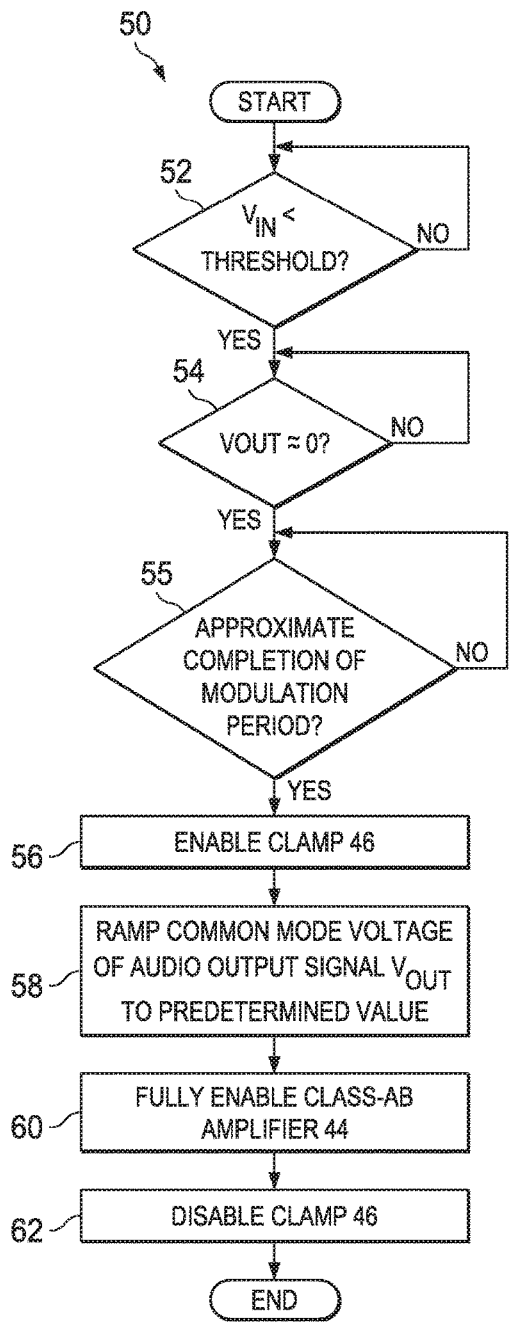
FIG. 4 is a flow chart of an example method for switching between a first mode of a final output stage of an amplifier and a second mode of the final output stage of the amplifier, in accordance with embodiments of the present disclosure.

FIG. 4 is a flow chart of an example method 50 for switching between a first mode of a final output stage 24 of amplifier 16 and a second mode of final output stage 24 of amplifier 16, in accordance with embodiments of the present disclosure. According to some embodiments, method 50 begins at step 52. As noted above, teachings of the present disclosure are implemented in a variety of configurations of personal audio device 1. As such, the preferred initialization point for method 50 and the order of the steps comprising method 50 may depend on the implementation chosen.

At step 52, control circuit 28 may monitor intermediate signal $V_{INT}$, audio output signal $V_{OUT}$, or another signal indicative of analog input signal $V_{IN}$, to determine if analog input signal $V_{IN}$ has decreased from above to below a threshold amplitude. If analog input signal $V_{IN}$ has decreased from above to below the threshold amplitude, method 50 may proceed to step 54. Otherwise, method 50 may remain at step 52 until such threshold amplitude crossing occurs.

At step 54, control circuit 28 may monitor audio output signal $V_{OUT}$ to determine when the amplitude of audio output signal $V_{OUT}$ is approximately zero (e.g., when a modulated signal generated by class-D audio output stage 42 is at its minimum voltage in its generated pulse train). If audio output signal $V_{OUT}$ has reached approximately zero, method 50 may proceed to step 55. Otherwise, method 50 may remain at step 54 until audio output signal $V_{OUT}$ reaches approximately zero.

At step 55, control circuit 28 may monitor audio output signal $V_{OUT}$ to determine when the modulated output signal output by Class-D audio output stage 42 is at an approximate completion of a modulation period. If the modulated output signal output by Class-D audio output stage 42 is at an approximate completion of a modulation period, method 50 may proceed to step 56. Otherwise, method 50 may remain at step 55 until the modulated output signal output by Class-D audio output stage 42 is at an approximate completion of a modulation period.

At step 56, control circuit 28 may enable clamp 46, thus shorting the output terminals at the amplifier output of amplifier 16 together, forcing audio output signal $V_{OUT}$ to zero. At step 58, class-AB audio output stage 44 (or another auxiliary amplifier, not shown in FIG. 3) may ramp a common mode voltage of audio output signal $V_{OUT}$ to a predetermined value (e.g., one-half of a supply voltage for class-AB audio output stage 44). At step 60, control circuit 28 may fully enable class-AB audio output stage 44 such that audio output signal $V_{OUT}$ is an unmodulated signal which is a function of intermediate signal $V_{INT}$. At step 62, control circuit 28 may disable clamp 46, thus allowing audio output signal $V_{OUT}$ to take on a non-zero value driven by class-AB audio output stage 44. After completion of step 62, method 50 may end.

Although FIG. 4 discloses a particular number of steps to be taken with respect to method 50, method 50 may be executed with greater or fewer steps than those depicted in FIG. 4. In addition, although FIG. 4 discloses a certain order of steps to be taken with respect to method 50, the steps comprising method 50 may be completed in any suitable order.

Method 50 may be implemented using personal audio device 1 or any other system operable to implement method 50. In certain embodiments, method 50 may be implemented partially or fully in software and/or firmware embodied in computer-readable media and executable by a controller.

Figure 5:
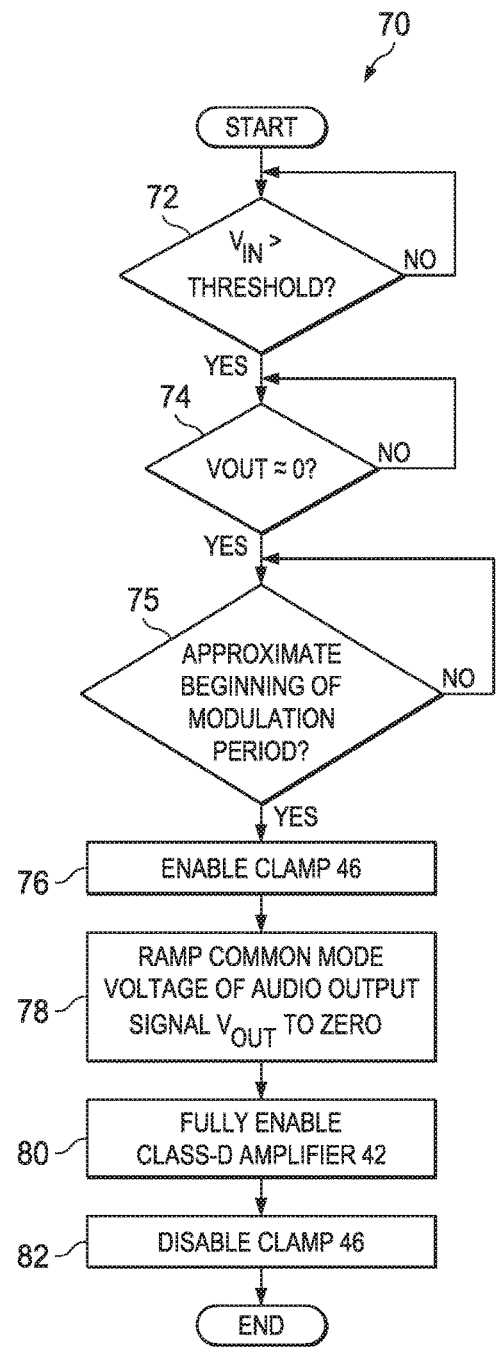
FIG. 5 is a flow chart of an example method for switching between a second mode of a final output stage of an amplifier and a first mode of the final output stage of the amplifier, in accordance with embodiments of the present disclosure.

FIG. 5 is a flow chart of an example method 70 for switching between a second mode of final output stage 24 of amplifier 16 and a first mode of final output stage 24 of amplifier 16, in accordance with embodiments of the present disclosure. According to some embodiments, method 70 begins at step 72. As noted above, teachings of the present disclosure are implemented in a variety of configurations of personal audio device 1. As such, the preferred initialization point for method 70 and the order of the steps comprising method 70 may depend on the implementation chosen.

At step 72, control circuit 28 may monitor intermediate signal $V_{INT}$, audio output signal $V_{OUT}$, or another signal indicative of analog input signal $V_{IN}$, to determine if analog input signal $V_{IN}$ has increased from below to above a threshold amplitude (which may be the same threshold as that of step 52, or a different threshold). If analog input signal $V_{IN}$ has increased from below to above the threshold amplitude, method 70 may proceed to step 74. Otherwise, method 70 may remain at step 72 until such threshold amplitude crossing occurs.

At step 74, control circuit 28 may monitor audio output signal $V_{OUT}$ to determine when the amplitude of audio output signal $V_{OUT}$ is approximately zero (e.g., when audio output signal $V_{OUT}$ experiences a zero crossing). If audio output signal $V_{OUT}$ is approximately zero, method 70 may proceed to step 75. Otherwise, method 70 may remain at step 74 until audio output signal $V_{OUT}$ is approximately zero.

At step 75, control circuit 28 may monitor audio output signal $V_{OUT}$ to determine when the modulated output signal output by Class-D audio output stage 42 is at an approximate beginning of a modulation period. If the modulated output signal output by Class-D audio output stage 42 is at an approximate beginning of a modulation period, method 70 may proceed to step 76. Otherwise, method 70 may remain at step 75 until the modulated output signal output by Class-D audio output stage 42 is at an approximate beginning of a modulation period.

At step 76, control circuit 28 may enable clamp 46, thus shorting the output terminals at the amplifier output of amplifier 16 together, forcing audio output signal $V_{OUT}$ to zero. At step 78, class-D audio output stage 42 (or another auxiliary amplifier, not shown in FIG. 3) may ramp a common mode voltage of audio output signal $V_{OUT}$ to zero. At step 80, control circuit 28 may fully enable class-D audio output stage 42 such that audio output signal $V_{OUT}$ is a modulated signal which is a function of intermediate signal $V_{INT}$. At step 82, control circuit 28 may disable clamp 46, thus allowing audio output signal $V_{OUT}$ to take on a non-zero value driven by class-D audio output stage 42. After completion of step 82, method 70 may end.

Although FIG. 5 discloses a particular number of steps to be taken with respect to method 70, method 70 may be executed with greater or fewer steps than those depicted in FIG. 5. In addition, although FIG. 5 discloses a certain order of steps to be taken with respect to method 70, the steps comprising method 70 may be completed in any suitable order.

Method 70 may be implemented using personal audio device 1 or any other system operable to implement method 70. In certain embodiments, method 70 may be implemented partially or fully in software and/or firmware embodied in computer-readable media and executable by a controller.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An amplifier comprising:
    a plurality of stages comprising at least:
        a first stage configured to receive an input signal at an amplifier input and generate an intermediate signal at an intermediate output which is a function of the input signal; and
        a final output stage configured to generate an output signal at an amplifier output, wherein the output signal is a function of the intermediate signal; and
    a signal feedback network coupled between the amplifier output and the amplifier input;
    wherein the final output stage is switchable among a plurality of modes including at least:
        a first mode in which the final output stage generates the output signal as a modulated output signal which is a function of the intermediate signal; and
        a second mode in which the final output stage generates the output signal as an unmodulated output signal which is a function of the intermediate signal; and
    wherein structure of the signal feedback network and the first stage remain static when switching between the first mode and the second mode and when switching between the second mode and the first mode.

2. The amplifier of claim 1, wherein the final output stage is configured to switch between the plurality of modes based on a characteristic of at least one of the input signal and the output signal.

3. The amplifier of claim 2, wherein the characteristic comprises at least one of a frequency of the input signal, an amplitude of the input signal, and a noise characteristic of the input signal.

4. The amplifier of claim 2, wherein the characteristic comprises an amplitude of the output signal, and the final output stage is configured to switch between the first mode and the second mode when an amplitude of the output signal is approximately zero.

5. The amplifier of claim 2, wherein the final output stage is configured to:
    switch between the first mode and the second mode at an approximate completion of a modulation period of the modulated output signal; and
    switch between the second mode and the first mode at an approximate beginning of another modulation period of the modulated output signal.

6. The amplifier of claim 1, wherein a signal gain of the final output stage in the first mode is approximately equal to a signal gain of the final output stage in the second mode.

7. The amplifier of claim 1, wherein an offset of the final output stage in the first mode is approximately equal to an offset of the final output stage in the second mode.

8. The amplifier of claim 1, wherein a signal gain of the final output stage in the second mode is calibrated to match a signal gain of the final output stage in the first mode.

9. The amplifier of claim 1, wherein an offset of the final output stage in the second mode is calibrated to match an offset of the final output stage in the first mode.

10. The amplifier of claim 1, wherein the modulated output signal comprises a pulse-modulated signal.

11. The amplifier of claim 10, wherein the pulse-modulated signal comprises one of a pulse-width modulated signal and a pulse-density modulated signal.

12. The amplifier of claim 1, wherein the unmodulated output signal comprises a continuous-time baseband signal.

13. The amplifier of claim 1, wherein when the final output stage is operating in the second mode, at least one of the signal feedback network and the first stage is modified to decrease a noise floor of the amplifier.

14. The amplifier of claim 1, wherein:
    the amplifier comprises a Class-D modulator; and
    the final output stage operates as an open-loop switched-mode driver in the first mode and operates as a continuous-time closed-loop amplifier in the second mode.

15. The amplifier of claim 1, wherein when the final output stage is operating in the second mode, the amplifier comprises a first feedback loop including the signal feedback network and a second feedback loop coupled between the amplifier output and the intermediate output.

16. A method for operating an amplifier having a plurality of stages comprising at least a first stage configured to receive an input signal at an amplifier input and generate an intermediate signal which is a function of the input signal, and a final output stage configured to generate an output signal at an amplifier output, wherein the output signal is a function of the intermediate signal, and a signal feedback network coupled between the amplifier output and the amplifier input, the method comprising, switching the final output stage among a plurality of modes including at least a first mode in which the final output stage generates the output signal as a modulated output signal which is a function of the intermediate signal, and a second mode in which the final output stage generates the output signal as an unmodulated output signal which is a function of the intermediate signal, wherein structure of the signal feedback network and the first stage remain static when switching between the first mode and the second mode and when switching between the second mode and the first mode.

17. The method of claim 16, further comprising switching between the plurality of modes based on a characteristic of at least one of the input signal and the output signal.

18. The method of claim 17, wherein the characteristic comprises at least one of a frequency of the input signal, an amplitude of the input signal, and a noise characteristic of the input signal.

19. The method of claim 17, wherein the characteristic comprises an amplitude of the output signal, and the method comprises switching between the first mode and the second mode when an amplitude of the output signal is approximately zero.

20. The method of claim 17, further comprising:
    switching the final output stage between the first mode and the second mode at an approximate completion of a modulation period of the modulated output signal; and
    switching the final output stage between the second mode and the first mode at an approximate beginning of another modulation period of the modulated output signal.

21. The method of claim 16, wherein a signal gain of the final output stage in the first mode is approximately equal to a signal gain of the final output stage in the second mode.

22. The method of claim 16, wherein an offset of the final output stage in the first mode is approximately equal to an offset of the final output stage in the second mode.

23. The method of claim 16, further comprising calibrating a signal gain of the final output stage in the second mode to match a signal gain of the final output stage in the first mode.

24. The method of claim 16, further comprising calibrating an offset of the final output stage in the second mode to match an offset of the final output stage in the first mode.

25. The method of claim 16, wherein the modulated output signal comprises a pulse-modulated signal.

26. The method of claim 25, wherein the pulse-modulated signal comprises one of a pulse-width modulated signal and a pulse-density modulated signal.

27. The method of claim 16, wherein the unmodulated output signal comprises a continuous-time baseband signal.

28. The method of claim 16, further comprising, when the final output stage is operating in the second mode, modifying at least one of the signal feedback network and the first stage to decrease a noise floor of the amplifier.

29. The method of claim 16, wherein:
the amplifier comprises a Class-D modulator; and
the final output stage operates as an open-loop switched-mode driver in the first mode and operates as a continuous-time closed-loop amplifier in the second mode.

30. The method of claim 16, wherein when the final output stage is operating in the second mode, the amplifier comprises a first feedback loop including the signal feedback network and a second feedback loop coupled between the amplifier output and the intermediate output.

* * * * *